United States Patent [19]

Kabacoff et al.

[11] Patent Number: 5,298,106
[45] Date of Patent: Mar. 29, 1994

[54] METHOD OF DOPING SINGLE CRYSTAL DIAMOND FOR ELECTRONIC DEVICES

[75] Inventors: Lawrence T. Kabacoff, Columbia; John Barkyoumb, Beltsville, both of Md.

[73] Assignee: The United States of America as represented by the Secretary of the Navy, Washington, D.C.

[21] Appl. No.: 726,489

[22] Filed: Jul. 8, 1991

[51] Int. Cl.$^5$ .............................................. C30B 30/00
[52] U.S. Cl. .......................... 156/605; 156/DIG. 68; 423/446; 437/24
[58] Field of Search ....... 156/605, DIG. 68, DIG. 73, 156/DIG. 80, DIG. 105; 423/446; 437/11

[56] References Cited

U.S. PATENT DOCUMENTS

| | | | |
|---|---|---|---|
| 4,603,082 | 7/1986 | Zelez | 437/20 |
| 4,849,199 | 7/1989 | Pinneo | 156/DIG. 68 |
| 4,988,640 | 1/1991 | Bohling et al. | 437/233 |
| 4,997,636 | 3/1991 | Prins | 423/446 |

FOREIGN PATENT DOCUMENTS

8604330  2/1987  South Africa .

OTHER PUBLICATIONS

"Activation of Boron-Dopant Atoms in Ion-Implanted Diamonds"; Prins; *Physics Review B*: Condens. Matter, 38(8), pp. 5576–5584, month unknown.

"Laser Method for Synthesis and Processing of Continuous Diamond Films on Nondiamond Substrates"; Narayan et al.; *Science*, Apr. 1991, vol. 252, N5004, pp. 416–418.

*Primary Examiner*—Olik Chaudhuri
*Assistant Examiner*—Felisa Garrett
*Attorney, Agent, or Firm*—John D. Lewis; Roger D. Johnson

[57] ABSTRACT

A method of doping diamond by
(1) ion implanting carbon into the diamond to create a damage zone of opaque, nondiamond material;
(2) ion implanting a semiconductor dopant material that is a pentavalent donor dopant or a trivalent acceptor dopant into the damage zone of opaque, nondiamond carbon material;
(3) melting the opaque, nondiamond carbon material by lased light; and
(4) allowing the carbon melt to cool and crystallize homoepitaxially as diamond from the diamond surfaces during which the dopant material is incorporated into the new diamond lattice.

19 Claims, No Drawings

METHOD OF DOPING SINGLE CRYSTAL DIAMOND FOR ELECTRONIC DEVICES

BACKGROUND OF THE INVENTION

This invention relates to diamonds and more particularly to methods of doping diamonds.

It has been widely known for many years that diamond would be greatly superior to either silicon or GaAs as a material for integrated circuits. Reasons include the greater heat conductivity of diamond, the higher carrier mobilities, the higher operating temperatures, and the intrinsic radiating hardness such a "chip" would possess. The problem has been to find a way to dope diamond with suitable impurities to create n- and p- type semiconductors. The very compact structure of diamond coupled with the very high c—c bond energies prevent diffusion of dopants into the material. Moreover, diamond has an extremely high melting temperature, making the liquid hard to form. Ion implantation has been used to introduce the dopants into the structure. However, considerable lattice damage must be produced to allow the impurity atoms to get in. If too much damage is done, subsequent annealing graphitizes the structure. If too little damage is done, the dopants end up in interstitial rather than substitutional sites after annealing. In spite of the difficulties, efforts to produce diamond integrated circuits exceed one hundred million dollars annually.

It would be desirable to provide a practical method of doping diamonds to produce integrated circuits and other semiconductor devices.

SUMMARY OF THE INVENTION

Accordingly, an object of this invention is to provide a method of implanting ions into the crystal lattice of diamond.

Another object of this invention is to provide a method of implanting an intergrated circuit in a diamond substrate.

Yet another object of this invention is to provide new diamond semiconductors.

These and other objects of this invention are accomplished by providing a method of doping diamond by ion implantation comprising:

(1) ion implanting carbon into the diamond to create a damage zone of opaque, nondiamond carbon material;

(2) ion implanting a dopant material into the damage zone of opaque, nondiamond carbon material;

(3) melting the opaque nondiamond carbon material by lased light of a wavelength that the diamond is transparent to;

(4) allowing the carbon melt to cool and crystallize homoepitaxially as diamond starting from the diamond surfaces; and (5) repeating step (3) and (4) until all of the opaque, nondiamond carbon material has been converted to diamond.

Optionally, the diamond material may be annealed after step (1) but before step (2) to heal slightly damaged diamond and convert severely damaged diamond to nontransparent, nondiamond carbon material. Similarly, after step (2) but before step (3) addition diamond may be grown on the diamond surface to increase the depth of the ion implant.

DETAILED DESCRIPTION OF THE PREFERRED EMBODIMENT

Two important terms used in this specification are (1) diamond and (2) nondiamond carbon material. Diamond refers to diamond that is transparent to the laser light used in the present process. Nondiamond carbon material refers to the dark, laser light absorbent (nontransparent) carbon junk which is produced by damaging diamond during the carbon ion implanting and annealing steps. Nondiamond carbon material may include graphite, amorphous carbon, soot, or other dark carbon materials produced by damaging the diamond material.

Unlike prior art doping processes, the first step of present process creates a zone of dark, laser light absorbent nondiamond material within the transparent diamond substrate. To accomplish this, the carbon is ion implanted in the diamond at concentrations of about 10,000 times greater than the donor dopant ions and the acceptor dopant ions. The carbon ion implant concentration will preferably be from about $10^{15}$ to about $5\times10^{15}$ ions/cm$^2$, more preferably from $10^{15}$ to $2\times10^{15}$ ions/cm$^2$, and still more prerably from $10^{15}$ to $1.5\times10^{15}$ ions/cm$^2$. The implanted carbon ions damage transparent diamond and convert it to dark, absorbent nondiamond carbon. If too little carbon is implanted the damage will be slight and even annealing will not produce the dark, laser light absorbent nondiamond carbon areas needed. On the other hand, ion implanting a large excess of carbon will increase the cost and time of the process by increasing the number of laser pulses needed to convert the nondiamond material back to diamond later in the process.

The spot (circle) size of carbon ion implantation on the diamond is preferably from more than zero to 30, more preferably from about 1 to 30, still more preferably from 1 to 20, and even more preferably from 1 to 10 microns in diameter (or maximum linear dimension if a noncircle shape is used). Moreover, the carbon ion implantation into the diamond should be as deep as possible, preferably from 4 to 6 micron deep. Larger spot size or shallow carbon ion implantation creates a risk of a blow out of the diamond substrate during the adiabatic melting of the nondiamond carbon. Note, the limitation on the area of the implantation is related to the maximum amount of carbon melt that may be produced at one time. By using a series of implantations, larger areas and different geometries of semiconductors may safely be achieved.

Conventional techniques are used to ion implant the carbon. Masks are used to control the area of carbon ion implantation. The carbon ion implantation area corresponds to the combined ion implantation areas of the donor dopants materials and the acceptor dopant materials. The depth of the carbon ion implantation in the diamond substrate is controlled by adjusting the ion implant voltage.

The ion implantation of carbon into diamond results in several zones of material. At the center the diamond is converted to nondiamond carbon opaque materials such as graphite, amorphous carbon, soot, etc. Surrounding this nondiamond carbon is a zone of severely damaged diamond, followed by a zone of slightly damaged diamond and finally the undamaged diamond substrate.

A preferred, but optional, next step is to anneal the carbon ion implanted diamond substrate. Annealing converts severely damaged diamond into nondiamond carbon material. In contrast annealing heals the slightly damaged diamond. As a result, annealing produces a sharper boundary between the nondiamond carbon material and the nondamaged diamond. In some cases carbon is implanted in sufficient amounts to severely damage a zone of diamond but not to convert the diamond to nondiamond carbon material. No dark area will be apparent in the diamond substrate. In such a case, annealing will convert the severely damaged, but still transparent, diamond into dark, opaque laser light absorbent nondiamond carbon material. If the ion implanted carbon area of the diamond fails to form a dark, opaque area of nondiamond carbon even after annealing, then the concentration of ion implanted carbon must be increased.

Annealing is preferably done with a laser. The laser proves localized heating of the area being annealed. The laser used for annealing may be the laser used to melt the nondiamond carbon material later in the process. For annealing the pulse power will only be about one thousandth of that used for the melting step later.

In the next step, conventional techniques are used to ion implant the donor and the acceptor dopant materials into the dark, laser light absorbent nondiamond carbon areas in the diamond substrate. Masks are used to control the areas of donor dopant and of acceptor dopant ion implantations. The implantation voltages are adjusted to control the depth of the ion implantation.

Suitable dopant materials include those conventionally used in silicon semiconductors or integrated circuits. For example, pentavalent donor materials such as arsenic, phosphorous, antimony, or nitrogen, may be used to produce n-type semiconductor materials in the diamond. Or trivalent acceptor materials such as aluminum, gallium, indium, or boron may be used to produce p-type semiconductor materials in the diamond. The concentration of dopant materials implanted will be that conventionally used in silicon semiconductors and will depend upon the purpose of the semiconductor or intergrated circuit.

In the next step a laser is used to melt the nondiamond carbon areas. The diamond substrate materials are transparent to the laser light and thus do not absorb energy from the laser light beams. In contrast, the nondiamond materials absorb the laser light and are heated and melted.

Because of the high thermal conductivity of diamond, heat is rapidly drawn away from the melted carbon material. It is desirable to minimize the heat lost in this way prior to the complete melting of the nondiamond carbon material. Therefore, the necessary energy is delivered in short high powered laser pulses. Preferably a single short pulse is used in each melting step. The length of each laser pulse is preferably from about 1 to about 20 nanoseconds, more preferably from 1 to 10 nanoseconds, and still more preferably from 1 to 5 nanoseconds. The power lever at which the laser operates is selected to deliver the necessary energy in the selected pulse time.

The amount of energy required to melt the nondiamond carbon materials depends on factors such as the amount and distribution of the noncarbon material as well as the type of noncarbon material. In general preferably from about 1 to about 3, more preferably from 1 to 2, and still more prerably from 1.2 to 1.6 Joules per square millimeter of nondiamond carbon materials is used. Assuming a 2 micron thick implantation layer, then the corresponding ranges of energy per volume will be about 2 to 6, 2 to 4, and 2.4 to 3.2 joules per cubic millimeter of implanted material. If too little energy is used, the nondiamond carbon will not be totally melted. On the other hand, if too much energy is used the nondiamond carbon material will be melted and the melt-raised to a temperature high enough to char the nearby diamond substrate. Thus, the goal is to use enough energy to melt all the nondiamond carbon material and to use less than the amount of energy which would damage the nearby diamond substrate material.

After the nondiamond carbon material has melted, the molten carbon is allowed to cool and crystallize out. The molten carbon will crystallize out as diamond at the diamond substrate surface next to the carbon melt. During the crystallization, the donor dopant atoms and the acceptor dopant atoms present in the carbon melt will be incorporated into the diamond lattice, producing the n-type or p-type semiconductor diamond material.

Melting the nondiamond carbon material generates great pressures inside the diamond substrate. This can result in explosions which will damage the diamond substrate and even eject pieces of substrate. This is more likely to occur when the nondiamond carbon area is formed near the surface or has a large surface area. This damage can be prevented by growing diamond on the ion implanted surface. Growing the diamond epitaxily on the ion implanted surface is equivalent to implanting the carbon, donor, and acceptor ions deeper into the diamond substrate. Preferably, a polycrystalline diamond layer is grown on the ion implanted diamond substrate surface. The polycrystalline diamond coating offers more protection because it is less likely to cleave or fracture. However, the laser beam cannot be projected through the polycrystalline surfaces as effectively. Instead, the laser light beam enters the diamond substrate from the opposite and uncoated surface. After the melting and recrystallization as diamond, the protective diamond coating may be removed by conventional methods such as grinding.

The diamond substrate materials used in this process are transparent to the laser light. Thus, natural and synthetic industrial diamonds which are opaque are unsuitable for this process. Natural and synthetic diamonds which are clear white in appearance will be suitable for this process. Diamonds which are clear but are tinted (e.g., reddish, yellow, etc.) may be used but the laser light used in the process will be limited to higher wavelengths.

A laser capable of short, high powered pulses is used. The laser is operated a wavelength at which the diamond substrate is transparent. Preferably the wavelength of light is at least 300 nm, and more preferably at least 400 nm. Preferably the laser should not be operated at a wavelength above the infrared range, and more preferably not above the near infrared range. As the wavelength of the laser light is increased above the width of the nondiamond carbon area, the efficiency of the energy transfer decreases.

Pulse lasers using neodynium ions in yttrium aluminum garnet (YAG) crystals operating at 1060 nm are excellent for producing n-type and p-type semiconductor areas around 1 micron (1000 nm) wide in diamond substrates according to this process.

Numerous other modifications and variations of the present invention are possible in light of the foregoing teachings. It is therefore to be understood that within the scope of the appended claims the invention may be practiced otherwise than as specifically described.

We claim:

1. A method of doping diamond by ion implantation comprising:
   (1) ion implanting carbon into the diamond to create a damage zone of opaque, nondiamond carbon material;
   (2) ion implanting a semiconductor dopant material that is a pentavalent donor dopant material or a trivalent acceptor dopant material into the damage zone of opaque, nondiamond carbon material;
   (3) melting the opaque nondiamond carbon material by lased light of a wavelength that the diamond is transparent to;
   (4) allowing the carbon melt to cool and crystallize homoepitaxially as diamond starting from the diamond surfaces; and
   (5) repeating steps (3) and (4) until all of the opaque, nondiamond material has been converted to diamond.

2. The method of claim 1 wherein in step (1) the carbon is ion implanted into the diamond in a concentration of from about $1 \times 10^{15}$ to about $5 \times 10^{15}$ ions/cm$^2$.

3. The method of claim 2 wherein in step (1) the carbon is ion implanted into the diamond in a concentration of from $1 \times 10^{15}$ to $2 \times 10^{15}$ ions/cm$^2$.

4. The method of claim 3 wherein in step (1) the carbon is ion implanted into the diamond in a concentration of from $1 \times 10^{15}$ to $1.5 \times 10^{15}$ ions/cm$^2$.

5. The method of claim 1 wherein the surface area of the carbon ion implant has a maximum linear dimension of from more than zero to about 30 microns.

6. The method of claim 5 wherein the surface area of the carbon ion implant has a maximum linear dimension of from about 1 to about 20 microns.

7. The method of claim 6 wherein the surface area of the carbon ion implant has a maximum linear dimension of from 1 to 10 microns.

8. The method of claim 1 wherein after step (1) but before step (2) the carbon ion implantation zone is annealed with lased light energy in a concentration of from $1.0 \times 10^{-3}$ to $3.0 \times 10^{-3}$ joules/mm$^2$.

9. The method of claim 8 wherein the annealing is done with lased light energy in a concentration of from $1.0 \times 10^{-3}$ to $2.0 \times 10^{-3}$ joules/mm$^2$.

10. The method of claim 9 wherein the annealing is done with lased light energy in a concentration of from $1.0 \times 10^{-3}$ to $1.5 \times 10^{-3}$ joules/mm$^2$.

11. The method of claim 1 wherein in step (2) the semiconductor dopant material is a pentavalent donor dopant that is arsenic, phosphorous, antimony, or nitrogen.

12. The method of claim 1 wherein in step (2) the semiconductor dopant material is a trivalent acceptor dopant that is aluminum, gallium, indium, or boron.

13. The method of claim 1 wherein in step (3) a single pulse of lased light of from about 1 to about 20 nanoseconds is used for each melt.

14. The method of claim 13 wherein the lased light pulse is from 1 to 10 nanoseconds long.

15. The method of claim 14 wherein the lased light pulse is from 1 to 5 nanoseconds long.

16. The method of claim 1 wherein in step (3) the concentration of lased light energy used is from about 1 to about 3 joules per square millimeter of opaque nondiamond carbon material.

17. The method of claim 16 wherein in step (3) the concentration of lased light energy used is from 1 to 2 joules per square millimeter of opaque nondiamond carbon material.

18. The method of claim 17 wherein in step (3) the concentration of lased light energy used is from 1 to 1.5 joules per square millimeter of opaque nondiamond carbon material.

19. The method of claim 1 wherein after step (2) but before step (3) a layer of polycrystalline diamond is grown on the implanted diamond surfaces to effectively increase the depth of the implantation and the lased light is then directed into the diamond from the opposite uncoated surface.

* * * * *